United States Patent
Niira

(10) Patent No.: US 8,941,160 B2
(45) Date of Patent: Jan. 27, 2015

(54) PHOTOELECTRIC CONVERSION MODULE AND METHOD OF MANUFACTURING THE SAME

(75) Inventor: Koichiro Niira, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 716 days.

(21) Appl. No.: 13/203,235

(22) PCT Filed: Feb. 26, 2010

(86) PCT No.: PCT/JP2010/053161
§ 371 (c)(1),
(2), (4) Date: Aug. 24, 2011

(87) PCT Pub. No.: WO2010/098467
PCT Pub. Date: Sep. 2, 2010

(65) Prior Publication Data
US 2011/0304002 A1    Dec. 15, 2011

(30) Foreign Application Priority Data
Feb. 27, 2009    (JP) .................................. 2009-046516

(51) Int. Cl.
*H01L 31/0264* (2006.01)
*H01L 31/18* (2006.01)
*H01L 27/142* (2014.01)
*H01L 31/042* (2014.01)
(Continued)

(52) U.S. Cl.
CPC .......... *H01L 27/1423* (2013.01); *H01L 31/042* (2013.01); *Y02E 10/50* (2013.01)
USPC .......................................... 257/292; 257/443

(58) Field of Classification Search
CPC ..................... H01L 27/14643; H01L 27/1463; H01L 27/14665; H01L 27/14687; H01L 27/14625; H01L 27/14632
USPC ................... 257/290–294, E27.133, 432–443
See application file for complete search history.

(56) References Cited

U.S. PATENT DOCUMENTS

| | | |
|---|---|---|
| 4,315,096 A | 2/1982 | Tyan et al. |
| 6,380,478 B1 | 4/2002 | Yamamoto et al. |

(Continued)

FOREIGN PATENT DOCUMENTS

| | | |
|---|---|---|
| JP | H06-060155 U | 8/1994 |
| JP | H09-018029 A | 1/1997 |

(Continued)

OTHER PUBLICATIONS

International Search Report and Written Opinion dated Apr. 13, 2010, issued by the Japanese Patent Office for International Application No. PCT/JP2010/053161.

(Continued)

*Primary Examiner* — Cuong Q Nguyen
(74) *Attorney, Agent, or Firm* — Procopio, Cory, Hargreaves & Savitch, LLP

(57) ABSTRACT

A photoelectric conversion module according to an embodiment of the present invention includes a plurality of units formed on a substrate and disposed parallel to each other, each including a plurality of photoelectric conversion cells formed in one direction, the plurality of units disposed in an orthogonal direction to the one direction, and a first separation region disposed between adjacent units of the units. In the solar cell module, each of the photoelectric conversion cells includes a second separation region, and the second separation region in one of the units is extended beyond the first separation region formed between one of the units and the other unit which is adjacent to the one of units toward a part of the other unit.

14 Claims, 13 Drawing Sheets

(56) References Cited

U.S. PATENT DOCUMENTS 6,858,461 B2 * 2/2005 Oswald et al. .................. 438/68
2006/0196536 A1 9/2006 Fujioka et al.

FOREIGN PATENT DOCUMENTS

| JP | 2001-036104 A | 2/2001 |
| JP | 2002-289885 A | 10/2002 |
| JP | 2001-036105 A | 2/2004 |
| JP | 2004-186443 A | 7/2004 |
| JP | 2006-245507 A | 9/2006 |

OTHER PUBLICATIONS

International Preliminary Report on Patentability issued for International Application No. PCT/JP2010/053161.

* cited by examiner

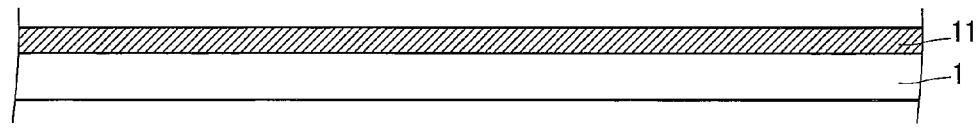
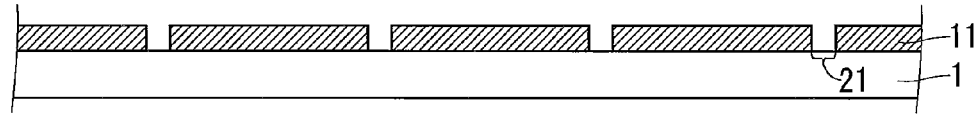
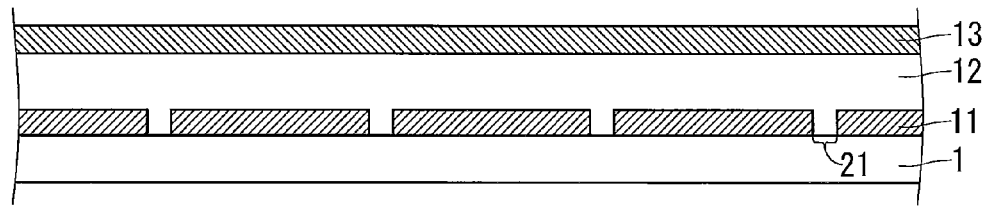
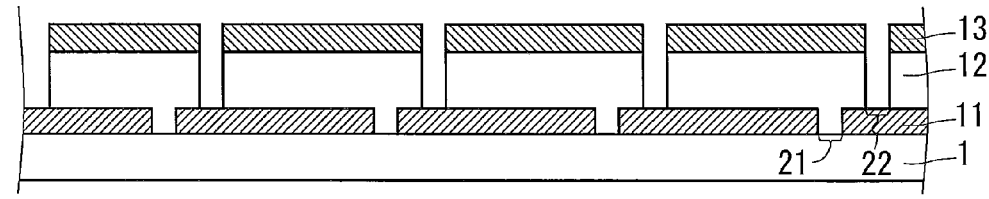
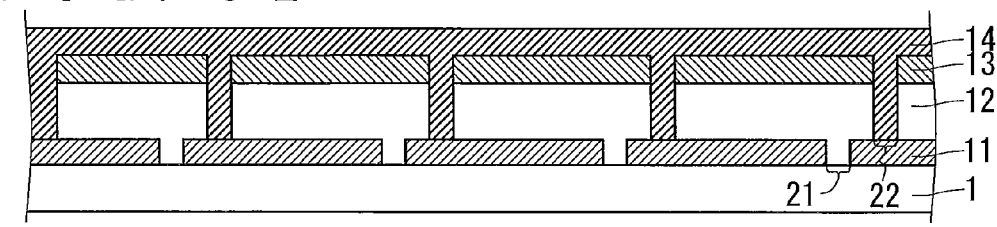
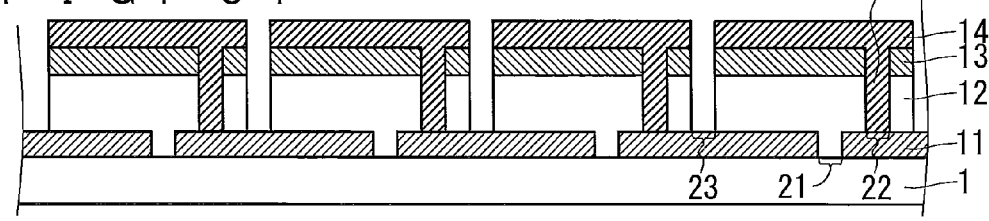
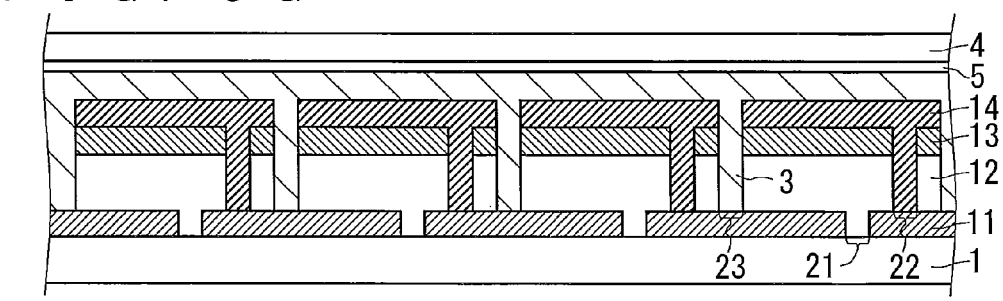

US 8,941,160 B2

PHOTOELECTRIC CONVERSION MODULE AND METHOD OF MANUFACTURING THE SAME

TECHNICAL FIELD

The present invention relates to a photoelectric conversion module constituted by electrically connecting a plurality of photoelectric conversion cells capable of converting an optical energy into an electrical energy, and a method of manufacturing the same.

BACKGROUND ART

Conventionally, a thin film solar cell module is known as one of photoelectric conversion modules for converting an optical energy into an electrical energy. For the thin film solar cell module, usually, there is employed a panel structure in which a plurality of solar cells (that is, photoelectric conversion cells) connected mutually and electrically is formed on a single board.

Moreover, there is known a solar cell module in which a plurality of units each including a plurality of solar cells are disposed in parallel and are connected electrically in series in a single panel structure so that a high output voltage can be obtained (for example, see Japanese Utility Model Application Laid-Open No. 6-60155, Japanese Patent Application Laid-Open No. 2001-36104 and Japanese Patent Application Laid-Open No. 2002-289885).

In recent years, a thin film solar cell module capable of obtaining a higher output voltage is required. The output voltage of the solar cell module is determined in an equation of [an output voltage of a single solar cell] by [the number of integration stages], for example. The number of integration stages indicates the number of solar cells to be connected electrically in series. In order to obtain a thin film solar cell module having a high output voltage, therefore, it is supposed to reduce a width of each solar cell, thereby increasing the number of integration stages.

Referring to the solar cell module in which the solar cell has a reduced width, however, an integration loss rate expressed in an equation of [a non-power generation area]/[a non-power generation area+an effective power generation area] is increased so that an efficient power generation cannot be realized. The effective power generation area and the non-power generation area indicate an area of a surface which mainly contributes to a power generation in a light receiving surface of each solar cell module and an area of a surface which does not contribute to the power generation, respectively.

In the case in which in order to reliably separate back electrode layers between regions of the adjacent solar cells, a width of a separation region for separating units is increased in consideration of a processing positional shift of a laser scribe, the power generation region contributing mainly to the power generation is decreased and the power generation loss is thus increased so that the efficient power generation cannot be implemented.

Further, in the case in which a separation region for separating cell regions for any of the units through the laser scribe is formed and a separation region between the cells regions for the adjacent unit is subsequently formed, it is necessary to reduce a scanning speed of a laser beam in the vicinity of the separation region between the units for the purpose of shifting the position of the laser scribe, resulting in deterioration in a productivity.

Therefore, there is desired a photoelectric conversion module which can implement an efficient power generation without decreasing a power generation region, and furthermore, is excellent in a productivity.

SUMMARY OF THE INVENTION

A photoelectric conversion module according to an embodiment of the present invention includes a plurality of units formed on a substrate and disposed parallel to each other, each including a plurality of photoelectric conversion cells formed in one direction and the plurality of units disposed in an orthogonal direction to the one direction, and a first separation region disposed between adjacent units of the units. In the solar cell module, each of the photoelectric conversion cells includes a second separation region, and the second separation region in one of the units is extended over the first separation region formed between the one of units and the other unit which is adjacent to the one of units toward a part of the other unit.

Moreover, a method of manufacturing a photoelectric conversion module according to an embodiment of the present invention is characterized in that the second separation region is formed by applying a laser beam.

BRIEF DESCRIPTION OF THE DRAWINGS

FIGS. 3A to 3G are sectional views typically showing a method of manufacturing a photoelectric conversion module according to the embodiment of the present invention, FIGS. 3A to 3G being sectional views for explaining manufacturing steps, respectively.

EMBODIMENTS FOR CARRYING OUT THE INVENTION

Figure 1A:
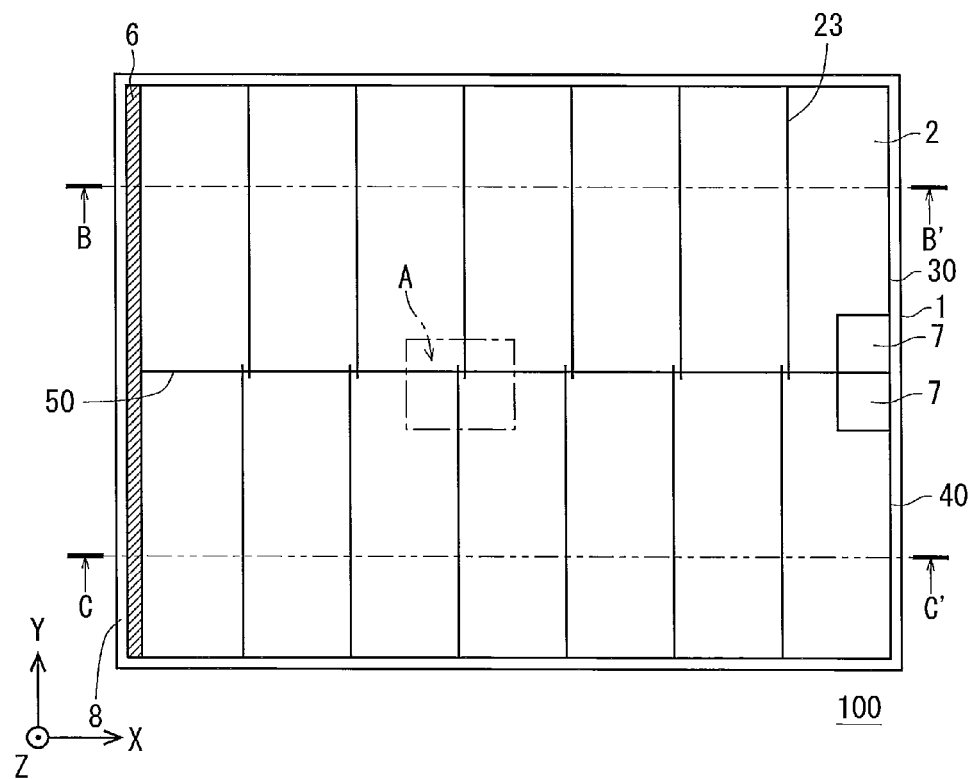
FIGS. 1A and 1B are plan view typically showing an example of a photoelectric conversion module according to an embodiment of the present invention, FIG. 1A being a plan view seen from one of main surfaces of the photoelectric conversion module and FIG. 1B being a perspective view showing a region A in FIG. 1A which is enlarged.

A photoelectric conversion module according to an embodiment of the present invention will be described in detail with reference to the drawings by taking a solar cell module as an example.

The solar cell module comprises a panel structure in which a single board is used as a substrate and a plurality of solar cells are electrically connected on the board, for example. Moreover, the solar cell module may comprise a structure which surrounds the panel structure with a frame member formed by a metal, a resin or the like or a structure which does not include the frame member, for example. In the embodiment, there is illustrated a solar cell module in which a frame member formed by aluminum, a steel member or the like is provided in an outer peripheral portion of the panel structure. Note that for simplicity of the drawings, the frame member is omitted and the panel structure of the solar cell module will be mainly described.

The same structures have the same reference numerals in the drawings and description of the structures is omitted. Moreover, the drawings include typical illustrations and a size of a structure, a positional relationship and the like in each of the drawings is not shown accurately. For example, a positional relationship between FIGS. 2A and 2B is not shown to accurately correspond to FIG. 1B. Although FIG. 3 shows corresponding portions to the section of FIG. 2A, an identical coordinate axis to that in FIG. 2A is omitted.

First Embodiment

[Structure of Solar Cell Module]

As shown in FIGS. 1A, 1B, 2A, and 2B, a solar cell module 100 includes a board 1. The board 1 is formed by a translucent material having an insulating property such as glass or plastic, and includes a main surface having a rectangular shape of 140 cm by 110 cm and a thickness of 2 to 5 mm, for example. Moreover, a first unit 30 formed by connecting a plurality of solar cells 2 in series and a second unit 40 formed by connecting a plurality of solar cells 2 in series in the same manner are mainly provided on the board 1. As shown in FIG. 3G, furthermore, the solar cell module 100 includes a protecting layer 3 covering a whole surface on which the solar cell 2 is formed and a back member 4 bonded to the protecting layer 3 with an adhesive layer 5 interposed therebetween.

As shown in FIGS. 2A and 2B, each of the solar cells 2 includes a first conductive layer 11, a photoelectric conversion layer 12 formed on the first conductive layer 11, a second conductive layer 13 formed on the photoelectric conversion layer 12, and a back electrode layer 14 formed on the second conductive layer 13. It is assumed that the solar cell 2 indicates a cell region as shown in figure, and furthermore, indicates a region including a second electrode separation groove 23 to be described below which is positioned in a boundary portion of one of the adjacent cell regions (a +X side in FIG. 2A) in addition to the cell itself.

The first conductive layer 11 is formed by a conductive material having a translucency, for example, TCO (Transparent Conductive Oxide) or the like and has a film thickness of approximately 500 nm to 1 μm. The photoelectric conversion layer 12 is formed by an amorphous semiconductor or/and a microcrystalline semiconductor and includes a semiconductor junction (for example, a pn junction or a pin junction) therein, and has a film thickness of approximately 0.2 μm to 5 μm. The second conductive layer 13 is formed by a conductive material having a translucency, for example, TCO or the like and has a film thickness of approximately 10 nm to 2 μm. The back electrode layer 14 is formed by a material such as silver having a high reflectance against light and has a film thickness of approximately 100 nm to 500 nm. It is possible to use silicon or the like for a semiconductor material constituting the photoelectric conversion layer 12. In the following, a solar cell comprising a photoelectric conversion layer formed by a silicon based material as a semiconductor material as described above will be referred to as a first solar cell.

For other solar cells, moreover, the present invention can also be applied to a solar cell using a chalcopylite based semiconductor material such as a CIS based (copper indium selenide based) semiconductor material or a CIGS based (copper indium gallium selenide based) semiconductor material (which will be hereinafter referred to as a second solar cell).

Figure 4:
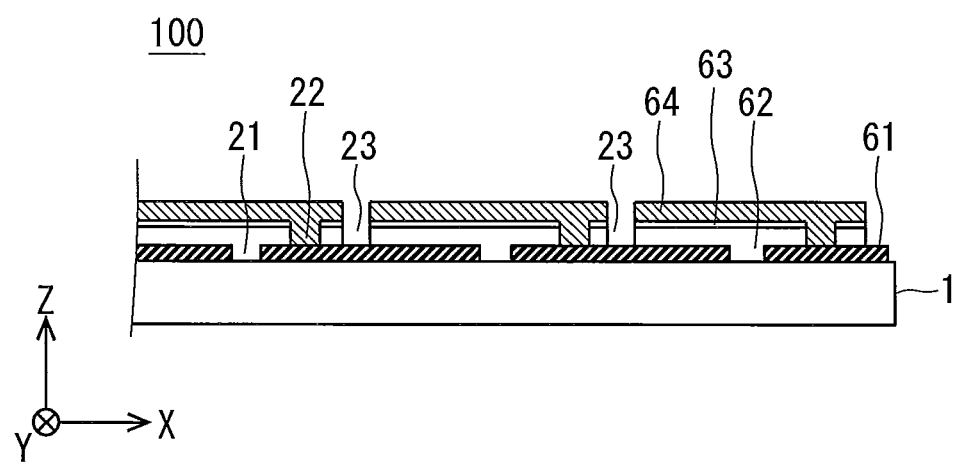
FIG. 4 is a sectional view typically showing an example of the photoelectric conversion module according to the embodiment of the present invention.

As shown in FIG. 4, for example, a solar cell module using the second solar cell includes the same lamination structure as that of a solar cell module using the first solar cell, and includes a board 1 formed by glass, ceramics, a resin, a metal or the like, and a first conductive layer 61, a light absorbing layer 62, a buffer layer 63 and a window layer 64 that is an electrode layer which are formed on the board 1 in this order.

The first conductive layer 61 is constituted by a metallic thin film of molybdenum, titanium, tantalum or the like or a lamination structure of the metals, for example, and has a film thickness of approximately 0.2 μm to 1 μm. The light absorbing layer 62 formed on the first conductive layer 61 is a semiconductor having a p conductivity type, contains a chalcopyrite based compound such as copper indium gallium diselenide or copper indium gallium diselenide sulfide, and has a film thickness of approximately 1 μm to 3 μm. The buffer layer 63 provided on the light absorbing layer 62 forms a heterojunction with the light absorbing layer 62 and is constituted by a mixed crystal compound semiconductor such as cadmium sulfide (CdS), indium sulfide (InS) or zinc sulfide (ZnS), and has a film thickness of approximately 0.01 μm to 0.1 μm. The window layer 64 formed on the buffer layer 63 is a semiconductor having an n conductivity type and is formed by a conductive material having a translucency such as zinc oxide (ZnO), and has a film thickness of approximately 1 μm to 2 μm. The window layer 64 can be regarded as one of electrodes (a surface electrode) on which light is incident.

Moreover, a transparent conductive film may be further formed on the window layer 64. In addition, a collecting electrode formed by a material having a low resistance such as silver may be provided on the transparent conductive film in order to enhance a collecting effect of a carrier.

The first conductive layer 61 is formed by a sputtering process or an evaporation process, for example. The light absorbing layer 62 is formed by the sputtering process, the evaporation process or a printing process, for example. The buffer layer 63 is formed by a chemical bath deposition process (CBD process), for example. The window layer 64 is formed by the sputtering process, a metal organic chemical vapor deposition process (MOCVD process) or the like, for example.

The solar cell module using the first solar cell will be mainly described below and the same technical idea can also be applied to a solar cell module using the second solar cell. In other words, by replacing the photoelectric conversion layer 12, the second conductive layer 13 and the back electrode layer 14 with the light absorbing layer 62, the buffer layer 63 and the window layer 64 on which light is incident, respectively, it is possible to produce the same effect as in the solar cell module using the first solar cell also in the solar cell module using the second solar cell.

As shown in FIGS. 2A and 2B, in each of the solar cells 2, the first conductive layer 11 is separated into a first conductive region 11a and a second conductive region 11b through a first electrode separation groove 21 which a part of the photoelectric conversion layer 12 enters. The second conductive region 11b is connected to the first conductive region 11a of the adjacent solar cell 2. Moreover, a part of the back electrode layer 14 enters a through hole 22 penetrating the photoelectric conversion layer 12 and the second conductive layer 13 so that a connecting region 22a is formed. Furthermore, a second electrode separation groove 23 separates the photoelectric conversion layer 12, the second conductive layer 13 and the back electrode layer 14 respectively. By the second electrode separation groove 23, a boundary portion between the adjacent solar cells 2 is formed.

The solar cell 2 includes a power generation region RE1 which mainly contributes to a power generation and a non-power generation region RE2 which does not mainly contribute to the power generation. The power generation region RE1 includes the first conductive region 11a and a portion formed on or above the first conductive region 11a in the photoelectric conversion layer 12, the second conductive layer 13 and the back electrode layer 14. The non-power generation region RE2 includes the second conductive region 11b and a portion formed on or above the second conductive region 11b in the photoelectric conversion layer 12, the second conductive layer 13 and the back electrode layer 14, and the connecting region 22a.

In this case, in the non-power generation region RE2, the back electrode layer 14 and the second conductive region 11b are connected to each other, and the second conductive region 11b is connected to the first conductive region 11a in the adjacent solar cell 2. Therefore, in the first unit 30 and the second unit 40, consequently, the adjacent solar cells are electrically connected to each other in series. In other words, an optical current flows in the solar cell 2 as shown in arrows AR1 and AR2 in FIGS. 2A and 2B.

In order to decrease power generation loss as greatly as possible, it is preferable that a width of the power generation region RE1 should be set to be 5 mm to 15 mm. Moreover, it is preferable that a width of the non-power generation region RE2 at this time should be set to be 0.3 mm to 0.5 mm.

With the structure described above, each of the solar cells 2 efficiently contributes to a conversion from an optical energy of sunlight or the like into an electrical energy. Consequently, it is possible to implement an efficient power generation without decreasing the power generation region. In addition, it is possible to produce a solar cell module which is excellent in a productivity.

Next, a planar arranging relationship between the respective portions of the solar cell module 100 will be described in detail.

As shown in FIG. 1A, the first unit 30 and the second unit 40 are disposed in parallel with an inter-unit separation region 50 (a first separation region) interposed therebetween. The first unit 30 and the second unit 40 are electrically connected in series through an inter-unit connecting region 6. Consequently, it is possible to take an electrical output from a pair of positive and negative output terminals 7 provided in one of side parts of the board 1 to an outside. Moreover, the solar cell 2 of the first unit 30 and the solar cell 2 of the second unit 40 have a rotational symmetrical relationship with each other as shown in the drawing, and serial connecting directions of the solar cells 2 are set to be reverse to each other. In other words, the first conductive region 11a and the second conductive region 11b are disposed in the +X direction in reverse order in each of the solar cells 2 between the first unit 30 and the second unit 40.

The inter-unit separation region 50 exposes the surface of the board 1 to electrically isolate the first unit 30 from the second unit 40.

Figure 1B:
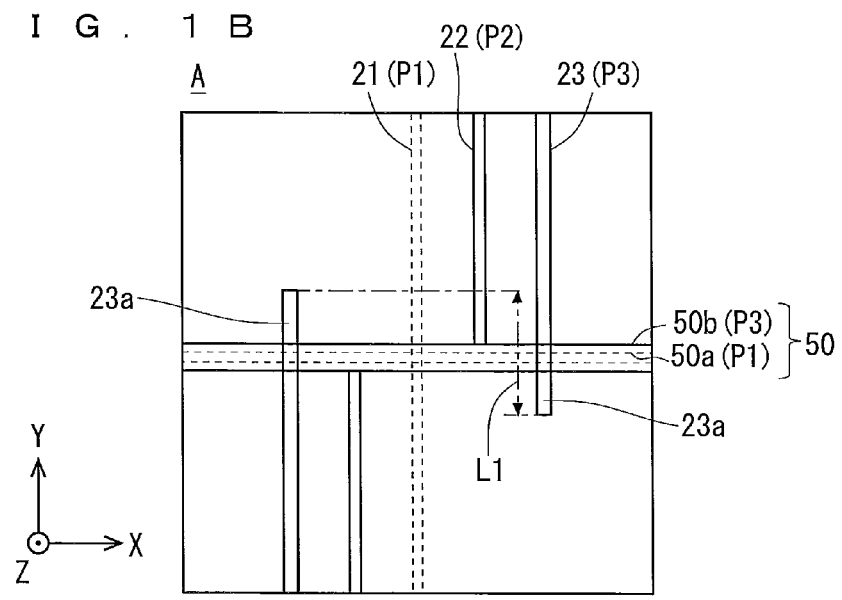
Figure 2A:
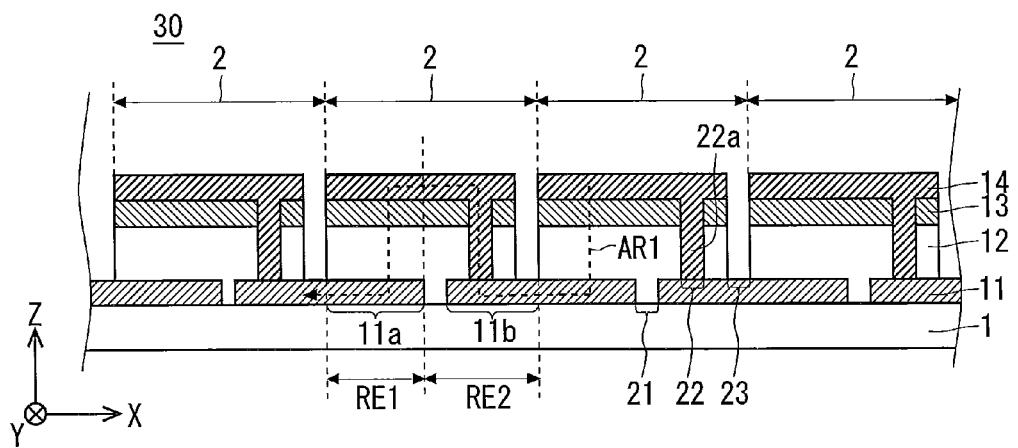
FIGS. 2A and 2B are sectional views typically showing an example of the photoelectric conversion module according to the embodiment of the present invention, FIG. 2A being a sectional view showing a part of a B-B' section in FIG. 1A and FIG. 2B being a sectional view showing a part of a C-C' section in FIG. 1A.
Figure 2B:
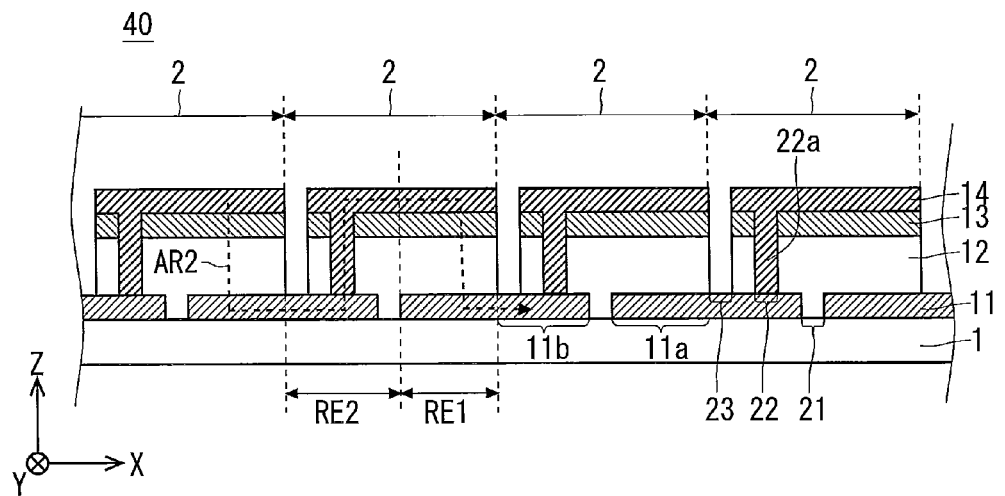

As shown in FIG. 1B, moreover, the second electrode separation grooves 23 (the second separation regions) in the first unit 30 are extended to a part of the second unit 40 over the inter-unit separation region 50 (the first separation region) formed between the first unit 30 and the second unit 40 which is adjacent thereto. More specifically, the first electrode separation groove 21, the through hole 22 and the second electrode separation groove 23 are formed in a perpendicular direction to the inter-unit separation region 50 (a direction along a Y axis in FIGS. 1A and 1B). The second electrode separation groove 23 of the first unit 30 and the second electrode separation groove 23 of the second unit 40 are not provided on a same straight line. The second electrode separation groove 23 in the first unit 30 includes a portion 23a formed with an extension in a predetermined length to the adjacent second unit 40 over the inter-unit separation region 50. Similarly, the second electrode separation groove 23 in the second unit 40 includes an extended portion 23a formed with an extension in a predetermined length to the adjacent first unit 30. In other words, the second separation region in one of the units is extended to a part of the other unit which is adjacent thereto.

Accordingly, the second electrode separation groove 23 in the first unit 30 and the second electrode separation groove 23 in the second unit 40 overlap with each other in a length L1 (a distance between a tip of the extended portion 23a in one of the units which are adjacent to each other and a tip of the extended portion 23a in the other unit) in a perpendicular direction (a +Y direction of FIG. 1A to an array direction of the solar cells 2 (the +X direction of FIG. 1A which is one direction as shown in FIG. 1B. The arrangement of the second electrode separation groove 23 implements an enhancement in an efficiency of a process for manufacturing the solar cell module 100 as will be described below. L1 is suitably 100 μm to 1500 μm and is more preferably equal to or smaller than 1000 μm in order to implement smooth scribing process without deterioration in power generation loss.

The through hole 22 in the first unit 30 and the through hole 22 in the second unit 40 are formed with a shift of 150 μm to 250 μm in reverse directions (the +X direction and a −X direction) along an X axis with respect to the first electrode separation groove 21. The second electrode separation groove 23 in the first unit 30 and the second electrode separation groove 23 in the second unit 40 are formed with a shift of 150 μm to 250 μm in the reverse directions (the +X direction and the −X direction) along the X axis with respect to the through hole 22.

Furthermore, an outer frame groove 8 is provided around the first unit 30 and the second unit 40 as shown in FIG. 1A in order to reduce a leakage occurring due to a deposit constituted by a material of the first conductive layer 11, the photoelectric conversion layer 12, the second conductive layer 13 or the back electrode layer 14 which is provided on the side surface of the board 1 in a formation of each of the layers. The outer frame groove 8 exposes the surface of the board 1. Moreover, the outer frame groove 8 is provided so that the protecting layer 3 enters a portion between an end which moisture tends to penetrate and the photoelectric conversion layer 12, so that a moisture resistance of the solar cell module 100 can be enhanced.

[Method of Manufacturing Solar Cell Module]

Next, a method of manufacturing the solar cell module 100 according to the first embodiment of the present invention will be described. The manufacturing method according to the present embodiment includes the following steps.

First of all, as shown in FIG. 3A, the first conductive layer 11 is formed on the board 1. As the first conductive layer 11, it is possible to form an $SnO_2$ layer by an MOCVD process or a sputtering process, for example.

As shown in FIG. 3B, then, a laser beam is applied to the first conductive layer 11 from the board 1 side and is scanned (a first laser irradiation). Consequently, the first conductive layer 11 is removed so that a plurality of grooves P1 including a first inter-unit separation groove 50a that is a part of the inter-unit separation region 50 and the first electrode separation groove 21 are formed (see FIG. 1B). In addition, it is possible to form a first outer frame groove (not shown) having a shape of a frame in an outer peripheral portion of the conductive layer 11 through the irradiation of the laser beam at this time. Depending on a condition, moreover, the laser beam may be applied from the first conductive layer 11 side.

In the present embodiment, the first laser irradiation and also second and third laser irradiations which will be described below are carried out by using a YAG laser device. There is used a YAG laser device capable of carrying out ON/OFF switching for an irradiation of a laser beam in a proper timing while moving a source for applying the laser beam. Moreover, it is also possible to use another laser device such as an $YVO_4$ laser, an excimer laser or a fiber laser in place of the YAG laser device.

As an irradiating condition in the first laser irradiation, for example, there is employed a condition having a wavelength of approximately 1060 μm, a frequency of 45 kHz to 150 kHz, a pulse width of 20 nsec to 60 nsec, an output of 5 W to 16 W, and an irradiation diameter of 50 μm to 80 μm.

As shown in FIG. 3C, subsequently, the photoelectric conversion layer 12 and the second conductive layer 13 are formed on or above the first conductive layer 11 and the board 1 in this order. As the photoelectric conversion layer 12, for example, it is possible to form an a-Si/μc-Si thin film tandem type solar cell element structure including an a-Si:H unit cell and a μc-Si:H unit cell by a plasma CVD process. As the second conductive layer 13, for example, it is possible to form a ZnO layer, a $SnO_2$ layer, an ITO layer or the like by an MOCVD process, a sputtering process or an evaporation process. In the process, a part of the photoelectric conversion layer 12 enters the first outer frame groove, the first inter-unit separation groove 50a and the first electrode separation groove 21.

As shown in FIG. 3D, then, the YAG laser device is used to apply a laser beam on the photoelectric conversion layer 12 and the second conductive layer 13 from the board 1 side and to scan the same (the second laser irradiation), so that the photoelectric conversion layer 12 and the second conductive layer 13 are removed so that the through hole 22 is formed as a plurality of grooves P2. In the second solar cell, the optical absorbing layer 62 and the buffer layer 63 are removed by mechanical scribing so that the through holes 22 are formed as the grooves P2.

As an irradiating condition in the second laser irradiation, for example, there is employed a condition having a wavelength of approximately 530 μm, a frequency of 20 kHz to 30 kHz, a pulse width of 26 nsec to 36 nsec, an output of 0.45 W to 0.75 W, and an irradiation diameter of 60 μm to 90 μm.

As shown in FIG. 3E, next, the back electrode layer 14 is formed on the second conductive layer 13. The back electrode layer 14 is an Ag layer formed by using a sputtering process, for example. At this step, a part of the back electrode layer 14 enters the through hole 22.

As shown in FIG. 3F, then, the YAG laser device is used to apply a laser beam on the back electrode layer 14, the second conductive layer 13 and the photoelectric conversion layer 12 from the board 1 side and to scan the same (the third laser irradiation), so that the back electrode layer 14, the second conductive layer 13 and the photoelectric conversion layer 12 are removed to form a plurality of grooves P3 comprising at least the second inter-unit separation groove 50b including the region of the first inter-unit separation groove 50a, and the second electrode separation groove 23. In addition, a second outer frame groove (not shown) is formed in the outer peripheral portions of the back electrode layer 14, the second conductive layer 13 and the photoelectric conversion layer 12 which include at least a region in which the first outer frame groove is to be formed. In the second solar cell, the mechanical scribing is used to remove the window layer 64, the buffer layer 63 and the optical absorbing layer 62, thereby forming at least a plurality of grooves P3 comprising the second inter-unit separation groove 50b including the region of the first inter-unit separation groove 50a, and the second electrode separation groove 23.

The second outer frame groove formed at this step and the first outer frame groove formed previously constitute the outer frame groove 8. The first inter-unit separation groove 50a and the second inter-unit separation groove 50b constitute the inter-unit separation region 50.

As an irradiating condition in the third laser irradiation, for example, there is employed a condition having a wavelength of approximately 530 μm, a frequency of 6 kHz to 10 kHz, a pulse width of 26 nsec to 36 nsec, an output of 0.3 W to 0.6 W, and an irradiation diameter of 70 μm to 100 μm.

In order to enhance a productivity of the solar cell module 100, it is preferable that the first to third laser irradiations should be carried out to efficiently form the grooves P1 to P3 in the shortest time, respectively. In the case shown in FIG. 5 which will be described below, a laser beam is applied in such a manner that the second electrode separation groove 23 in the first unit 30 and the second electrode separation groove 23 in the second unit 40 are formed alternately.

Figure 5:
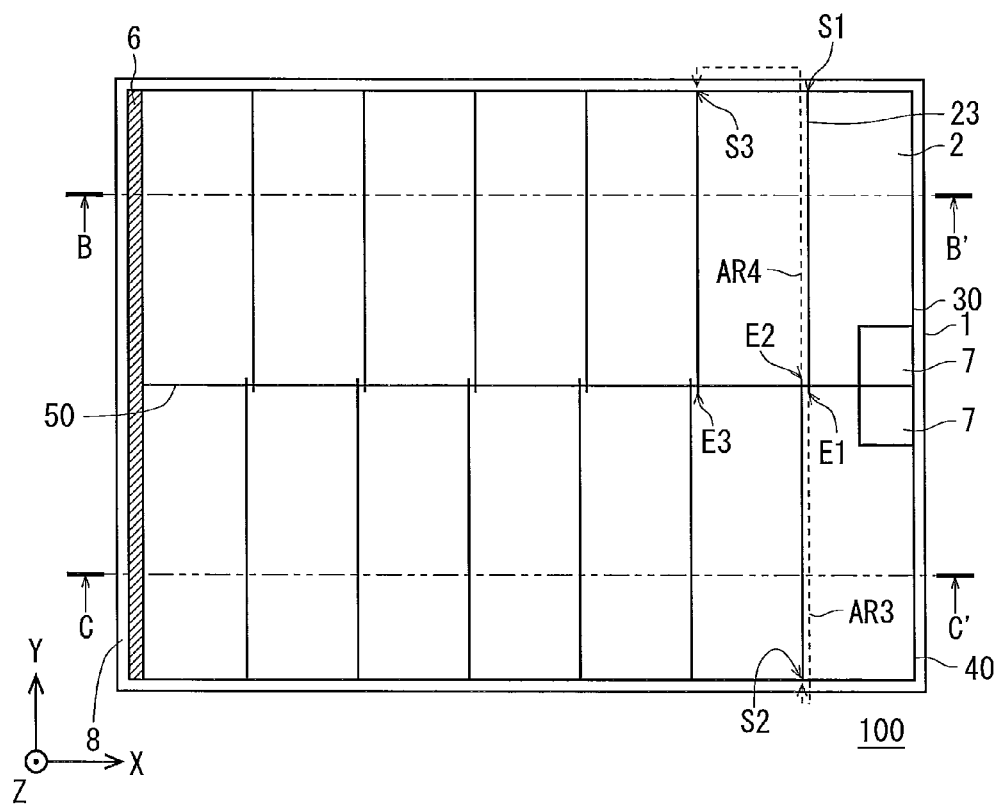
FIG. 5 is a plan view for typically explaining the method of manufacturing a photoelectric conversion module according to the embodiment of the present invention.

In detail, as shown in FIG. 5, the laser beam is first applied while an irradiating source is moved from a starting point S1 of the first unit 30 to an ending point E1 in a −Y direction. As shown in an arrow AR3 in a broken line, next, the irradiating source is moved without the irradiation of the laser beam from the end point E1 to a starting point S2 of the second unit 40. Then, the laser beam is applied while the irradiating source is moved from the starting point S2 of the second unit 40 to an ending point E2 in the +Y direction. As shown in an arrow AR4 in a broken line, thereafter, the irradiating source is moved without the irradiation of the laser beam from the ending point E2 to a starting point S3 of the first unit 30. Subsequently, the same operation is repeated so that the second electrode separation grooves 23 shown in FIG. 5 are formed in the solar cell module 100. In the serial process, although the irradiation of the laser beam is turned ON/OFF, the irradiating source is continuously moved at a certain scanning speed.

In the case in which the solar cell module is fabricated in such a manner that the second electrode separation groove 23 is not provided across the inter-unit separation region 50, it is necessary to decelerate the irradiating source before the inter-unit separation region 50 in such a manner that the laser beam is not continuously applied over the inter-unit separation region 50. In the present embodiment, however, the second electrode separation groove 23 in one of the units is extended to a part of the other unit, and therefore, it is not necessary to carry out the deceleration of the irradiating source. Accordingly, the solar cell module 100 is excellent in the productivity.

In addition, in the case in which the solar cell is fabricated in such a manner that the second electrode separation groove 23 is not provided across the inter-unit separation region 50, it is necessary to increase the width of the inter-unit separation region 50 in order to efficiently separate the back electrode layers 14 between the adjacent units. In the present embodiment, however, the second electrode separation grooves 23 are formed in such a manner that the second electrode separation grooves 23 in one of the units is extended to the other unit. Therefore, even if the laser processing for forming the inter-unit separation region 50 causes a slight misalignment in a ±Y direction, the separation of the back electrodes between the adjacent units is guaranteed. In the present embodiment, accordingly, it is not necessary to increase the width of the inter-unit separation region 50 in consideration of the misalignment in the laser processing. In other words, an enlargement of a power generation region and a reduction in a power generation loss are implemented in the solar cell module 100.

After the third laser irradiation is carried out, a metal residue formed by a structure material of the back electrode layer 14 or the connecting region 22a is generated in the inter-unit separation region 50 in some cases. In some cases in which the metal residue is generated, a short circuit occurs between the first unit 30 and the second unit 40. Accordingly, a photoelectric converting capability of the whole solar cell is deteriorated due to a current leakage caused by the short circuit in some cases. Therefore, the metal residue may be removed by applying the laser beam to the inter-unit separation region 50 again.

In the inter-unit connecting region 6 for connecting the first unit 30 to the second unit 40 in series, next, the groove P2 is also formed in the first unit 30 of the inter-unit connecting region 6 in the formation of the groove P2 so that the first conductive layer 11 and the back electrode layer 14 are connected to each other. The inter-unit separation region 50 is not provided in the inter-unit connecting region 6, so that the back electrode layer 14 of the first unit 30 and the back electrode layer 14 of the second unit 40 are connected to each other; and therefore, the first unit 30 and the second unit 40 are connected in series. The inter-unit separation region 50 may be provided in the inter-unit connecting region 6. In this case, it is preferable to form a connection wiring for connecting the back electrode layer 14 of the first unit 30 to the back electrode layer 14 of the second unit 40. At this time, it is also possible to separately form an electrode layer to be connected to the connection wiring on the back electrode layer 14. A plurality of grooves P2 to be provided on the first unit 30 in the inter-unit connecting region 6 may be disposed.

As shown in FIG. 3G, next, the protecting layer 3 constituted by an epoxy resin or the like is formed on the back electrode layer 14 and the board 1. Through this step, the protecting layer 3 enters the second electrode separation groove 23. Then, the adhesive layer 5 formed of EVA or the like is provided on the protecting layer 3, and furthermore, back member 4 constituted by a resin sheet such as PET, glass or the like is formed. Through the steps described above, the solar cell module 100 is formed. In the case in which the protecting layer 3 functions as the adhesive layer 5, for example, the case in which the EVA is used in the protecting layer 3, the adhesive layer 5 does not need to be provided separately.

As described above, according to the present embodiment, the second electrode separation grooves 23 are formed in such a manner that the second electrode separation groove 23 in one of the units is extended to the other unit, so that it is possible to implement the solar cell module 100 which is excellent in a productivity and has been reduced in a power generation loss.

Second Embodiment

Figure 6A:
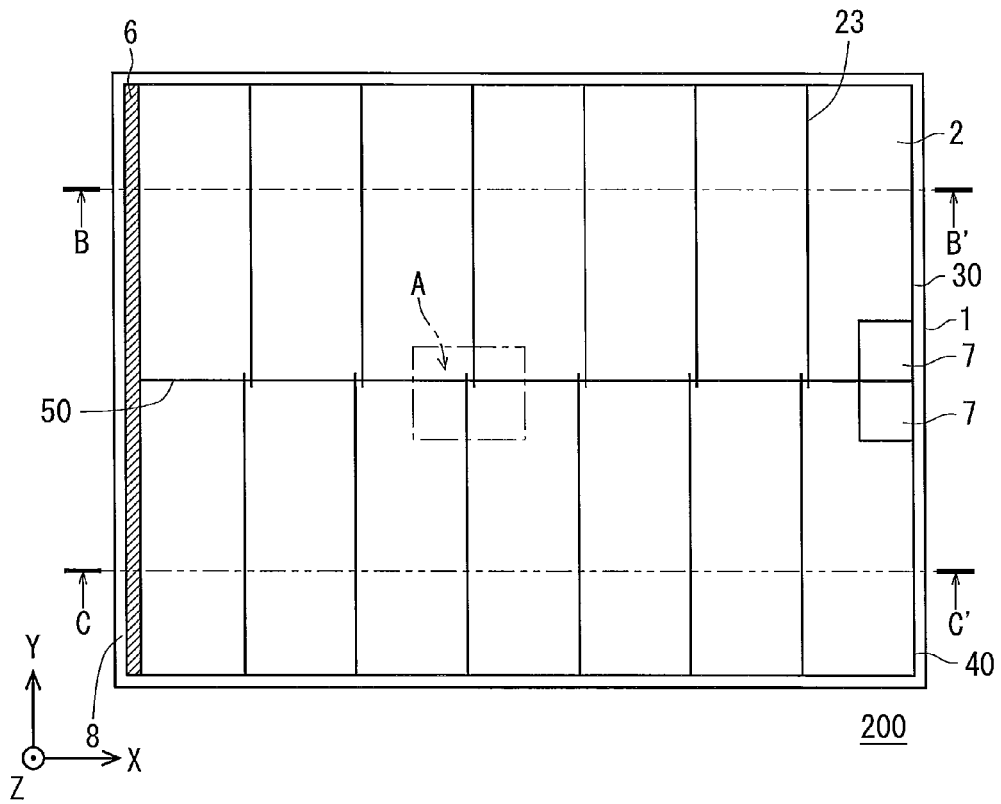
FIGS. 6A and 6B are plan views typically showing an example of the photoelectric conversion module according to an embodiment of the present invention, FIG. 6A being a plan view seen from one of main surfaces of the photoelectric conversion module and FIG. 6B being a perspective view showing the region A in FIG. 6A which is enlarged.
Figure 6B:
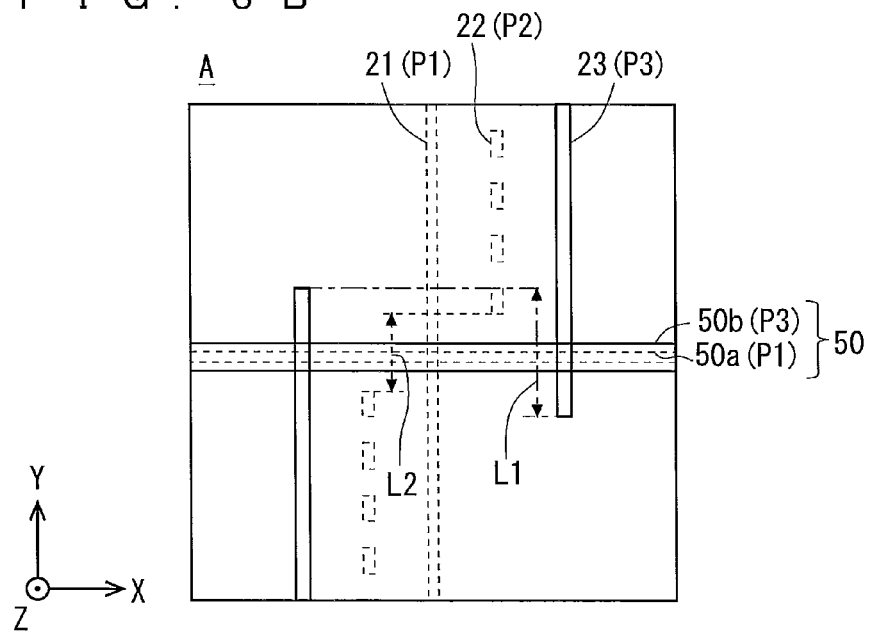

Next, a solar cell module 200 according to a second embodiment of the present invention will be described. With reference to FIGS. 6A and 6B, description will be given to a structure of the solar cell module 200 which is different from that of the solar cell module 100 according to the first embodiment.

As shown in FIG. 6B, in the solar cell module 200, a region (a connecting region 22a) in which a conductive material is put in a through hole 22 formed on each solar cell 2 intermittently does not cross the inter-unit separation region 50. Consequently, the through hole 22 in the first unit 30 and the through hole 22 in the second unit 40 are separated from each other by a length L2 in a perpendicular direction (the +Y direction of FIG. 6A) to an array direction (the +X direction of FIG. 6A) of the solar cells 2.

L2 is suitably 100 μm to 4000 μm, and is more preferably equal to or smaller than 2000 μm. By employing the range, the generation of a metal residue in the inter-unit separation region 50 is suppressed so that an electrical isolation between the adjacent units can be efficiently carried out.

When the through hole 22 in the first unit 30 and the through hole 22 in the second unit 40 are separated from each other, the generation of the metal residue in the inter-unit separation region 50 is suppressed, and therefore, it is possible to efficiently carry out the electrical isolation between the adjacent units. Consequently, it is possible to enhance a productivity of the solar cell module 200.

Moreover, the through hole 22 of the solar cell module 200 is intermittently provided as shown in FIG. 6B. This is implemented by discretely applying a laser beam in the formation of the through hole 22 instead of continuously applying the laser beam. The intermittent irradiation of the laser beam can be implemented by intermittently repeating the ON/OFF switching of the irradiation of the laser beam while an irradiating source is moved, for example. Alternatively, it is also possible to use a laser device having a mode for regulating an irradiating position by means of a galvanometer mirror.

In the case in which the galvanometer mirror is used in a laser processing, it is possible to employ a method of varying a mirror angle during a passage of an irradiating source through the length L2, thereby shifting an irradiating position for a laser beam in the −X direction when forming the through hole 22 in the first unit 30 and then forming the thorough hole 22 in the second unit 40. Accordingly, it is possible to employ a manufacturing method of forming the through hole 22 in the first unit 30 and the through hole 22 in the second unit 40 in a one-time processing work without reducing a processing speed, and therefore, it is possible to enhance the productivity of the solar cell module 200.

As described above, according to the present embodiment, the through hole 22 of each of the solar cells 2 is provided so as not to cross the inter-unit separation region 50, so that it is possible to implement the solar cell module 200 which is excellent in the productivity.

Third Embodiment

With reference to FIGS. 7 to 9C, next, a solar cell module 300 according to a third embodiment of the present invention will be described. In the following, description will be given to a structure of the solar cell module 300 which is different from that of the solar cell module 100 according to the first embodiment.

Figure 7:
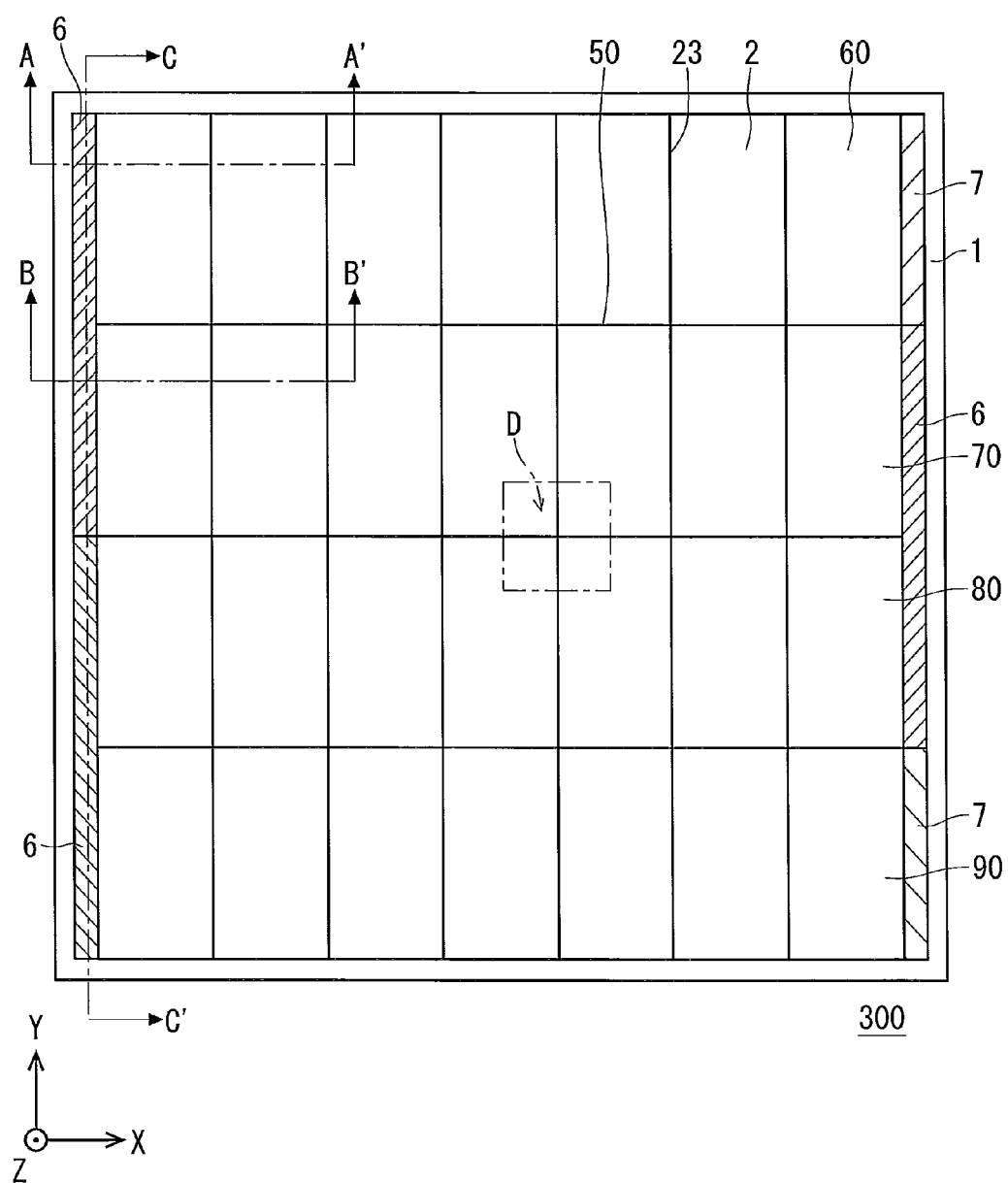
FIG. 7 is a plan view typically showing an example of the photoelectric conversion module according to an embodiment of the present invention.

As shown in FIG. 7, the second separation region (the second electrode separation groove 23) in each of the solar cell modules 100 and 200 according to the first and second embodiments serves to separate the electrode layer (more specifically, the back electrode layer 14), while a second separation region (a first electrode separation groove 21) of the solar cell module 300 serves to separate a conductive layer (more specifically, a first conductive layer 11) in a solar cell.

The solar cell module 300 is obtained by connecting, in series, a first unit 60, a second unit 70, a third unit 80 and a fourth unit 90 which are constituted through a connection of a plurality of solar cells 2 in series, respectively. An inter-unit separation region 50 that is a first separation region is formed between the adjacent units so that the units are separated from each other. The first unit 60 and the second unit 70 are connected in series through an inter-unit connecting region 6 positioned in the vicinity of an end at the −X side of the solar cell module 300, the second unit 70 and the third unit 80 are connected in series through the inter-unit connecting region 6 positioned in the vicinity of an end at the +X side of the solar cell module 300, and the third unit 80 and the fourth unit 90 are connected in series through the inter-unit connecting region 6 positioned in the vicinity of an end at the −X side of the solar cell module 300. Outputs of the units thus connected in series can be taken out at two output terminals 7 positioned in the vicinity of the end at the +X side of the solar cell module 300.

Figure 8:
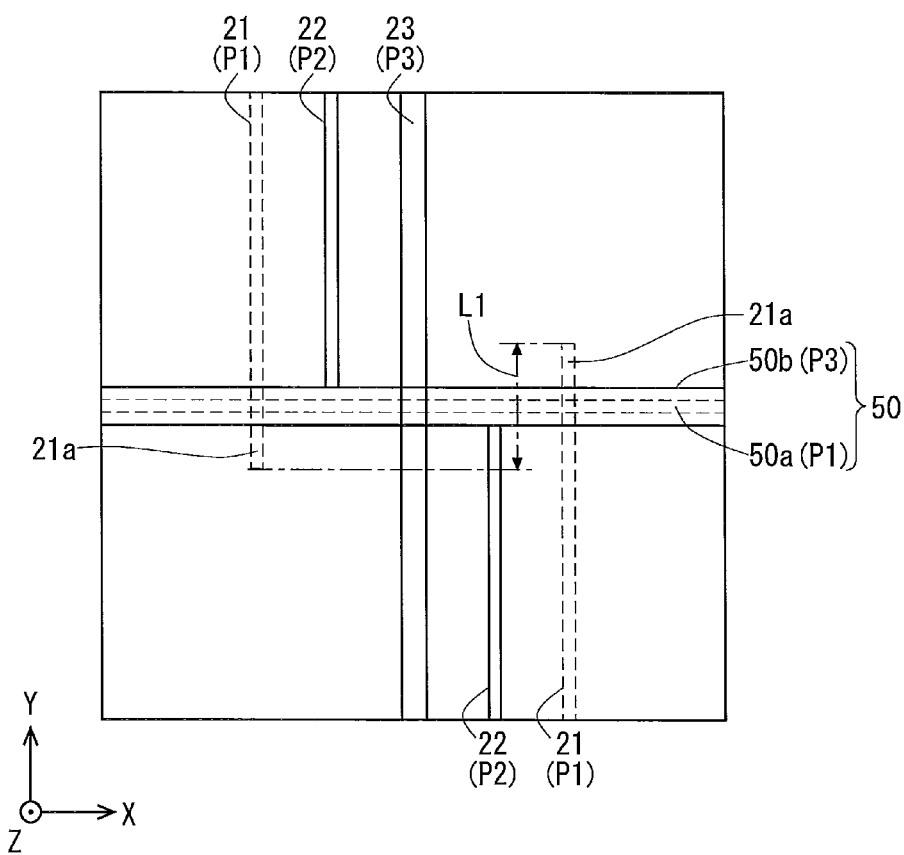
FIG. 8 is a planar perspective view showing a region D in FIG. 7 which is enlarged.

As shown in FIG. 8, second electrode separation grooves 23 of the first to fourth units 60 to 90 are provided on a same straight line in the solar cell module 300. On the other hand, the first electrode separation grooves 21 (the second separation regions) separating the first conductive layers 11 formed in the solar cells 2 of respective units are not provided on a same straight line. The first electrode separation groove 21 in one of the units includes a portion 21a formed with an extension in a predetermined length to a part of the other unit beyond the inter-unit separation region 50 between the adjacent units to each other. Similarly, the first electrode separation groove 21 in the other unit includes an extended portion 21a formed with an extension in a predetermined length to one of the units.

As shown in FIG. 8, accordingly, the first electrode separation groove 21 in the second unit 70 and the first electrode separation groove 21 in the third unit 80 overlap with each other in a length L1 (a distance between a tip of the extended portion 21a in one of the units and that of the extended portion 21a in the other unit in the adjacent units to each other) in a perpendicular direction (the +Y direction) to an array direction (the +X direction) of the solar cells 2 which is one of the directions, for example. The arrangement of the first electrode separation groove 21 as the second separation region implements an enhancement in an efficiency of a process for manufacturing the solar cell module 300 in the same manner as the arrangement of the second electrode separation groove 23 as the second separation region according to each of the first and second embodiments. L1 is suitably 100 μm to 1500 μm and is more preferably equal to or smaller than 1000 μm.

Figure 9A:
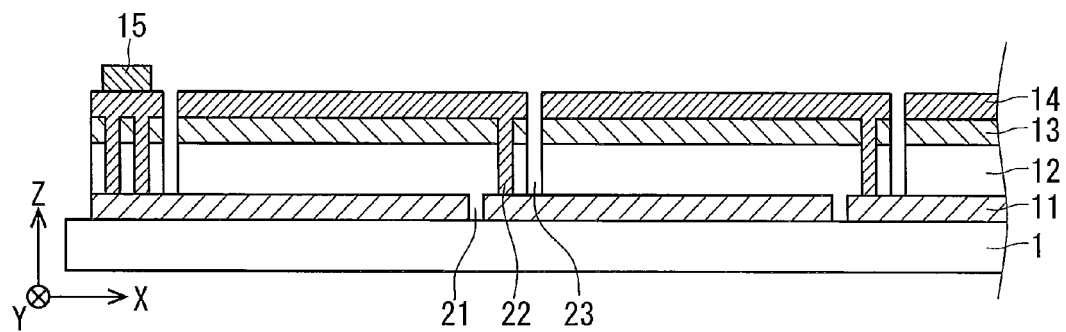
FIGS. 9A to 9C are sectional views typically showing an example of the photoelectric conversion module according to the embodiment of the present invention, FIG. 9A being a sectional view showing an A-A' section in FIG. 7, FIG. 9B being a sectional view showing a B-B' section in FIG. 7, and FIG. 9C being a sectional view showing a C-C' section in FIG. 7.
Figure 9B:
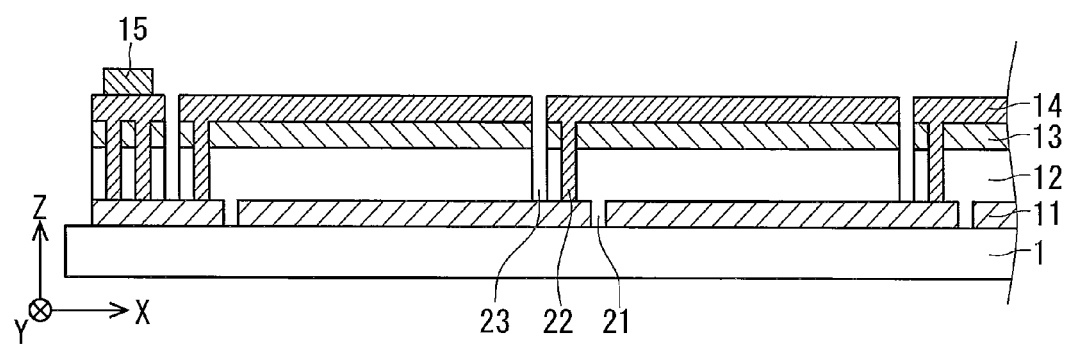
Figure 9C:
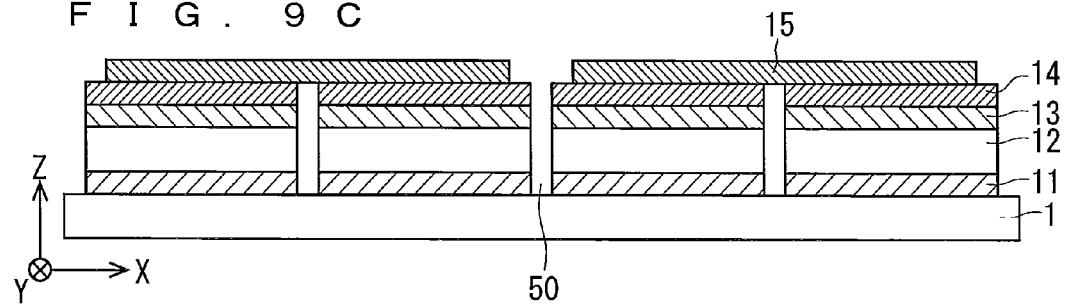
Figure 10:
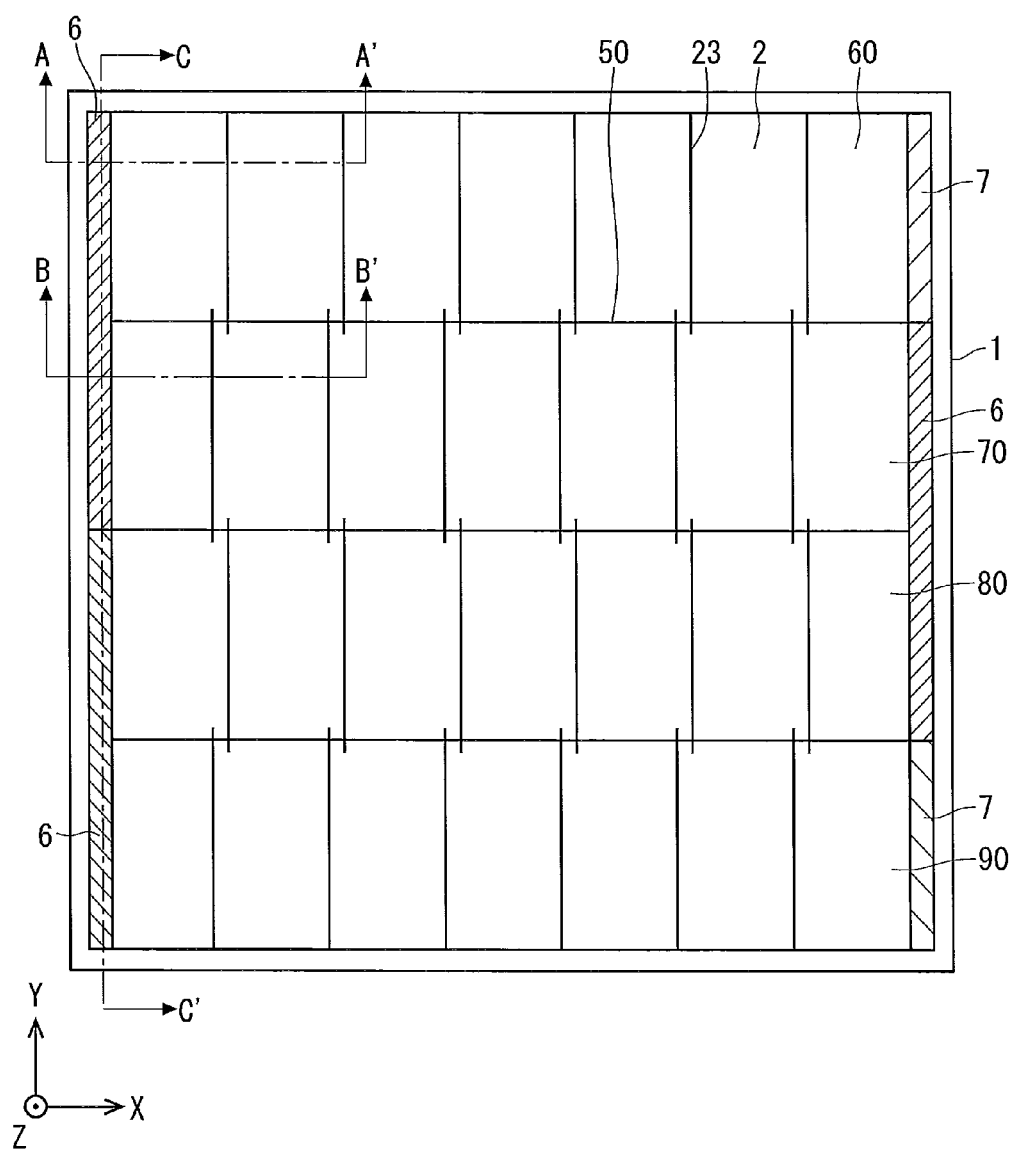
FIG. 10 is a plan view typically showing an example of the photoelectric conversion module according to an embodiment of the present invention.
Figure 11A:
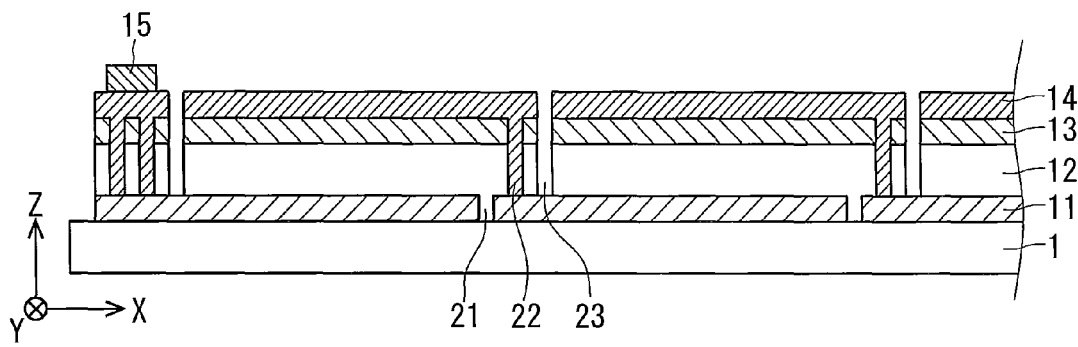
FIGS. 11A to 11C are sectional view typically showing an example of the photoelectric conversion module according to the embodiment of the present invention, FIG. 11A being a sectional view showing an A-A' section in FIG. 10, FIG. 11B being a sectional view showing a B-B' section in FIG. 10, and FIG. 11C being a sectional view showing a C-C' section in FIG. 10.
Figure 11B:
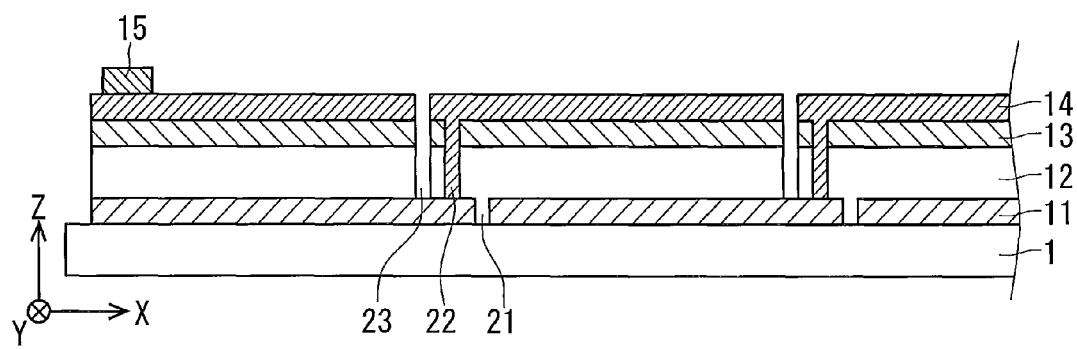
Figure 11C:
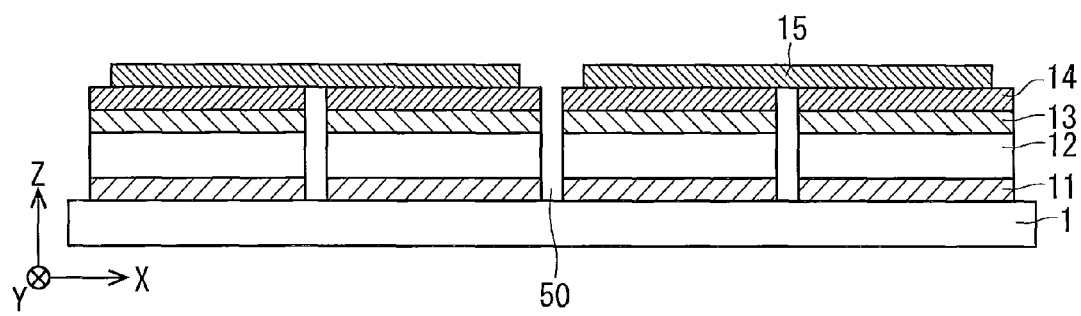
Figure 12:
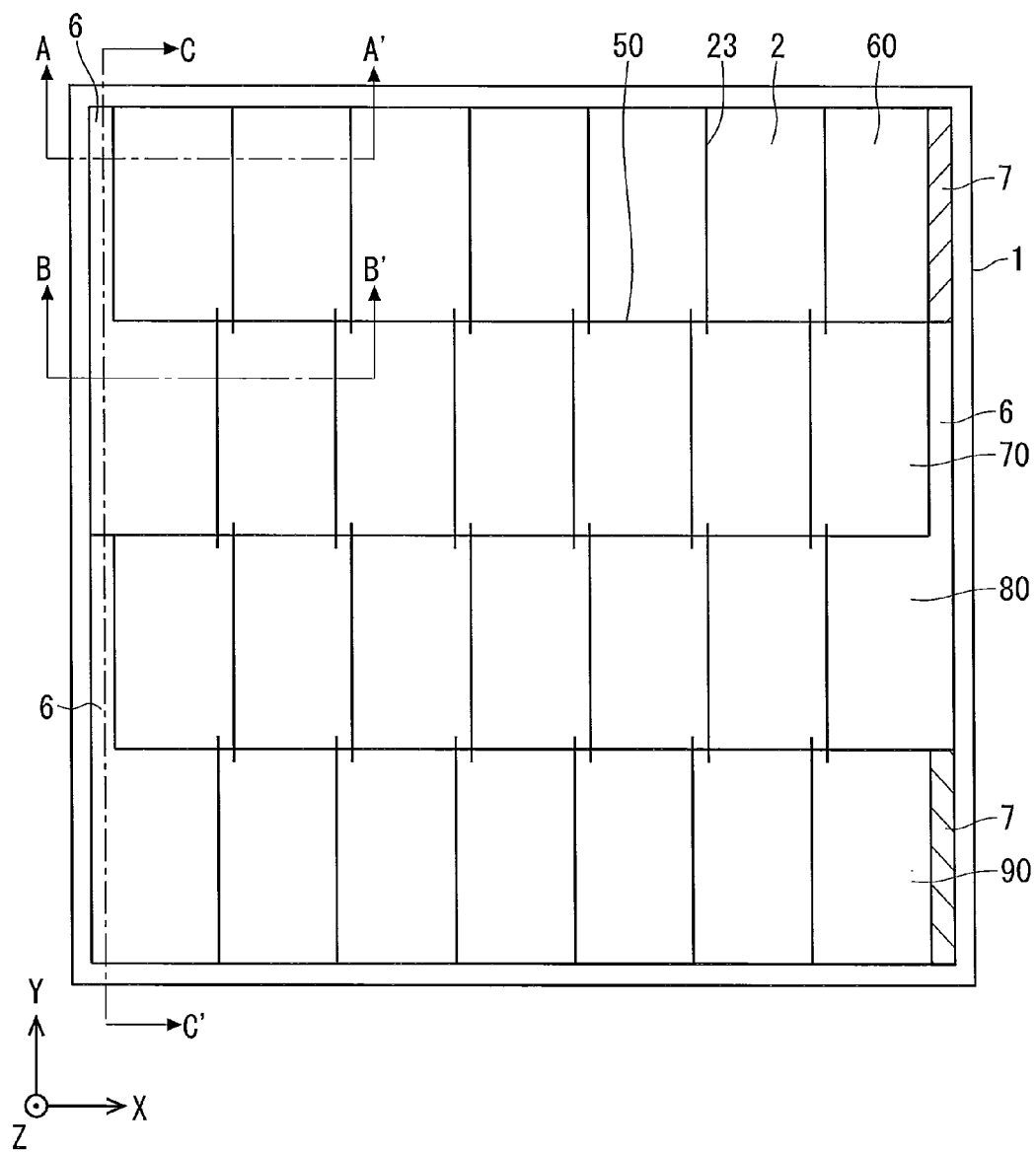
FIG. 12 is a plan view typically showing an example of the photoelectric conversion module according to an embodiment of the present invention.
Figure 13A:
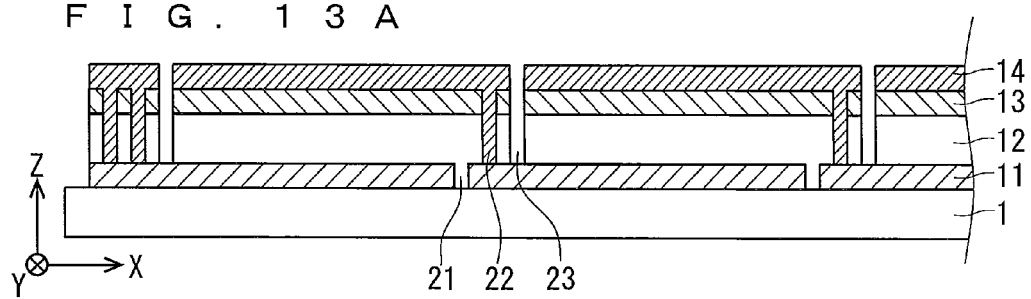
FIGS. 13A to 13C are sectional views typically showing an example of the photoelectric conversion module according to the embodiment of the present invention, FIG. 13A being a sectional view showing an A-A' section in FIG. 12, FIG. 13B being a sectional view showing a B-B' section in FIG. 12, and FIG. 13C being a sectional view showing a C-C' section in FIG. 12.
Figure 13B:
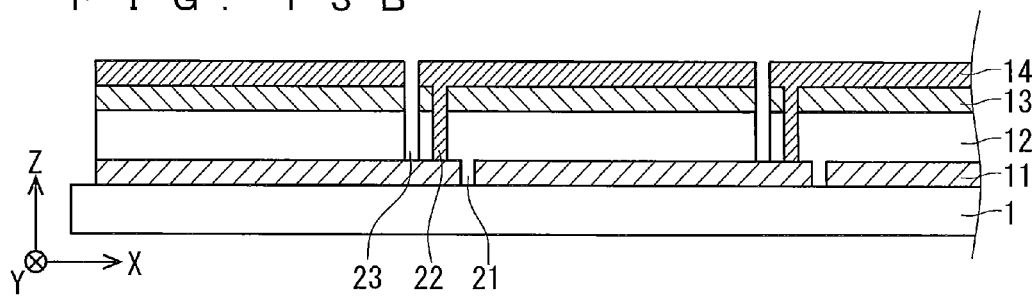
Figure 13C:
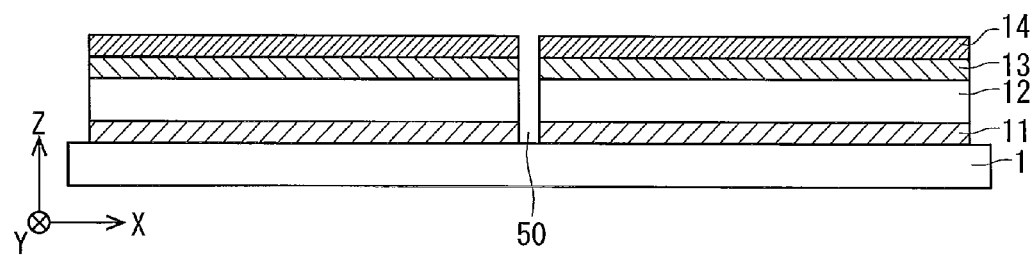

As shown in FIGS. 9A to 9C, referring to the inter-unit connecting region 6 for connecting the first unit 60 and the second unit 70 in series, the through hole (the groove P2) is formed on each of the first unit 60 and the second unit 70 in the inter-unit connecting region 6 so that the first conductive layer 11 and a back electrode layer 14 are connected to each other when the groove P2 is to be formed, for example. A connection wiring 15 for connecting the back electrode layer 14 of the first unit 60 to the back electrode layer 14 of the second unit 70 is formed so that the first unit 60 and the second unit 70 are connected in series. The inter-unit separation region 50 is not provided in the inter-unit connecting region 6 but the back electrode layer 14 of the first unit 60 and the back electrode layer 14 of the second unit 70 may be connected to each other.

In the process for manufacturing the solar cell module 300 according to the third embodiment, in the same manner as in the method of forming the second electrode separation groove 23 according to the first embodiment, a laser beam may be applied in such a manner that the first electrode separation groove 21 in one of the units and the first electrode separation groove 21 in the other unit are formed alternately.

According to the solar cell module 300 in accordance with the third embodiment, particularly, it is possible to efficiently fabricate the first electrode separation groove 21 for separating a first conductive layer 61 by applying a laser beam in the manufacture of a solar cell module using the second solar cell of such a type that the light absorbing layer 62 contains a chalcopyrite based semiconductor.

Furthermore, according to the solar cell module 300 in accordance with the third embodiment, light transmitted through the extended portion 21a can be reflected into the photoelectric conversion layer 12 in the case in which the back electrode layer 14 functions as a reflecting layer, which is more preferable.

<Variant>

Although the solar cell modules 100 and 200 according to the first and second embodiments shown in FIGS. 1A, 1B, 6A and 6B have been described by using the structure including the first unit 30 and the second unit 40, the present invention is not restricted to these modes but it is also possible to employ a structure including at least three units.

For example, as shown in FIGS. 10, 11A, 11B and 11C, it is also possible to employ a structure in which four units, that is, the first unit 60, the second unit 70, the third unit 80 and the fourth unit 90 constituted by connecting the solar cells 2 in series respectively are connected in series in the same manner as in the solar cell modules 100 and 200 illustrated in FIGS. 1A, 1B, 6A and 6B. Also in the case in which the example of the structure is employed, the inter-unit separation region 50 that is the first separation region is formed between the adjacent units to each other so that the units are separated from each other. Further, although the modes of the first electrode separation groove 21, the through hole 22 and the second electrode separation groove 23 are also the same as those in the solar cell modules 100 and 200 shown in FIGS. 1A, 1B, 6A and 6B, the second electrode separation grooves 23 (the second separation regions) in the second unit 70 and the third unit 80 are further extended to respective parts of the two adjacent units.

Furthermore, although the solar cell module comprises the second conductive layer 13 and the back electrode layer 14 formed on the photoelectric conversion layer 12 in the solar cell module in each of the embodiments described above, the surface electrode layer 14 may be instead formed on the photoelectric conversion layer 12 without the second conductive layer 13 provided.

Furthermore, although the second laser irradiation is carried out after the photoelectric conversion layer 12 and the second conductive layer 13 are formed in the embodiments described above, it is also possible to instead form the photoelectric conversion layer 12, to then carry out the second laser irradiation and to subsequently form the second conductive layer 13 and the back electrode layer 14. In addition, it is also possible to form only the second conductive layer 13 on the photoelectric conversion layer 12 without forming the back electrode layer 14.

Furthermore, referring to the solar cell module employing the second solar cell, it is also possible to form the optical absorbing layer 62, the buffer layer 63 and the window layer 64, to then form the through hole 22 and the second electrode separation groove 23, and to form an electrode layer constituted by silver or the like on at least the through hole 22. Furthermore, it is also possible to widely form the second electrode separation groove 23 and to form the electrode layer for connecting the first conductive layer 61 and the window layer 64 on one of the end sides of the second electrode separation groove 23 without providing the through hole 22.

Furthermore, although the outer frame groove 8 and the inter-unit separation region 50 are formed through the first laser irradiation and the third laser irradiation in the embodiments described above, it is also possible to instead form the second electrode separation groove 23 and to then remove the back electrode layer 14, the second conductive layer 13, the photoelectric conversion layer 12 and the first conductive layer 11, thereby forming the outer frame groove 8 and the inter-unit separation region 50 as the trench P4.

Furthermore, although the serial connection of the units is implemented by the connection wiring 15 in the inter-unit connecting region 6 as shown in FIGS. 9A to 9C, for example, in the embodiments described above, it is also possible to implement the serial connection by an electrode pattern of the back electrode layer 14, the window layer 64 illustrated in FIG. 4 or the like without using the connection wiring 15. For example, it is possible to connect the adjacent units to each other in series by providing a pattern in which the back electrode layer 14 is extended to an adjacent unit in the inter-unit connecting region 6 positioned on one of the end sides of the unit as shown in FIGS. 12, 13A, 13B and 13C.

Furthermore, although the photoelectric conversion layer 12 comprises the tandem structure in the embodiments described above, the present invention is not restricted thereto but it is also possible to comprise a single structure or a triple structure.

Furthermore, although the description has been given to the photoelectric conversion modules 100, 200 and 300 in which the photoelectric conversion cell is formed on a single planar board in the embodiments, the present invention is not restricted thereto but the technical idea of the present invention can also be applied to a photoelectric conversion module in which a photoelectric conversion cell is formed on a substrate in which at least a part of a surface takes a curved shape and/or a concavo-convex shape, for example.

In addition, the photoelectric conversion module is not restricted to the solar cell module if it can convert an optical energy into an electrical energy, and the technical idea of the present invention can also be applied to a photoelectric conversion module such as an optical sensor.

EXPLANATION OF DESIGNATION

1: board (substrate)
2: solar cell
3: protecting layer
4: back member
5: adhesive layer
6: inter-unit connecting region
7: output terminal
8: outer frame groove
11: first conductive layer
11a: first conductive region
11b: second conductive region
12: photoelectric conversion layer
13: second conductive layer
14: back electrode layer
15: connection wiring
21: first electrode separation groove
22: through hole
22a: connecting region
23: second electrode separation groove
30, 60: first unit
40, 70: second unit
50: inter-unit separation region
50a: first inter-unit separation groove
50b: second inter-unit separation groove
80: third unit
90: fourth unit
100, 200, 300: solar cell module (photoelectric conversion module)

The invention claimed is:

1. A photoelectric conversion module comprising:
a plurality of units formed on a substrate and disposed parallel to each other, each including a plurality of photoelectric conversion cells formed in one direction, the plurality of units disposed in an orthogonal direction to the one direction; and
a first separation region disposed between adjacent units of the units,
each of the photoelectric conversion cells including a second separation region, and
the second separation region in one of the units being extended over the first separation region formed between the one of units and the other unit which is adjacent to the one of units, from a first end of the other unit positioned close to the one of the units in the orthogonal direction to the one direction to an intermediate point toward a second end of the other unit positioned opposite to the one of the units, the second separation region not being extended to the second end.

2. The photoelectric conversion module according to claim 1, wherein each of the photoelectric conversion cells includes a conductive layer formed on the substrate, a photoelectric conversion layer formed on the conductive layer, and an electrode layer formed on the photoelectric conversion layer, the first separation region separates the conductive layers, the photoelectric conversion layers and the electrode layers between the adjacent units, respectively, and the second separation region separates at least the photoelectric conversion layers and the electrode layers in each of the photoelectric conversion cells, respectively.

3. The photoelectric conversion module according to claim 2, wherein each of the photoelectric conversion cells further includes a first conductive region and a second conductive region which are made by separation of the conductive layer, and a connecting region formed in the photoelectric conversion layer in an orthogonal direction to the one direction for electrically connecting the electrode layer to the second conductive region, and the second conductive region of each of the photoelectric conversion cells is connected to the first conductive region of the photoelectric conversion cell which is adjacent thereto in each of the units.

4. The photoelectric conversion module according to claim 2, wherein the photoelectric conversion layer contains a silicon based semiconductor.

5. The photoelectric conversion module according to claim 3, wherein the connecting region does not cross the first separation region.

6. The photoelectric conversion module according to claim 3, wherein order for disposing the first conductive region and the second conductive region in the one direction in each of the photoelectric conversion cells included in the one of units is reverse to order for disposing the first conductive region and the second conductive region in the one direction in each of the photoelectric conversion cells included in the other unit.

7. A method of manufacturing the photoelectric conversion module according to claim 1, wherein the second separation region is formed by applying a laser beam.

8. A method of manufacturing the photoelectric conversion module according to claim 3, wherein the connecting region is provided by putting a conductive material in a hole formed through an intermittent irradiation of a laser beam.

9. The photoelectric conversion module according to claim 1, wherein each of the photoelectric conversion cells include a conductive layer formed on the substrate, a photoelectric conversion layer formed on the conductive layer, and an electrode layer formed on the photoelectric conversion layer, and an electrode layer formed on the photoelectric conversion layer, the photoelectric conversion layer contains a chalcopyrite based semiconductor, the first separation region separates the conductive layers, the photoelectric conversion layers, and the electrode layers between the adjacent units, respectively, and the second separation region separates the conductive layers in each of the photoelectric conversion cells.

10. The photoelectric conversion module according to claim 9, wherein each of the photoelectric conversion cells further includes a first conductive region and a second conductive region which are made by separation of the conductive layer, and a connecting region formed in the photoelectric conversion layer in an orthogonal direction to the one direction for electrically connecting the electrode layer to the second conductive region, and the second conductive region of each of the photoelectric conversion cells is connected to the first conductive region of the photoelectric conversion cell which is adjacent thereto in each of the units.

11. The photoelectric conversion module according to claim 10, wherein the connecting region does not cross the first separation region.

12. The photoelectric conversion module according to claim 10, wherein order for disposing the first conductive region and the second conductive region in the one direction in each of the photoelectric conversion cells included in the one of units is reverse to order for disposing the first conductive region and the second conductive region in the one direction in each of the photoelectric conversion cells included in the other unit.

13. A method of manufacturing the photoelectric conversion module according to claim 9, wherein the second separation region is formed by applying a laser beam.

14. A method of manufacturing the photoelectric conversion module according to claim 10, wherein the connecting region is provided by putting a conductive material in a hole formed through an intermittent irradiation of a laser beam.

* * * * *